(12) United States Patent
Ishigami et al.

(10) Patent No.: US 6,801,083 B2
(45) Date of Patent: Oct. 5, 2004

(54) FEEDFORWARD AMPLIFIER

(75) Inventors: Takeshi Ishigami, Tokyo (JP); Yoshinari Nanao, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/453,733

(22) Filed: Jun. 4, 2003

(65) Prior Publication Data

US 2004/0017253 A1 Jan. 29, 2004

(30) Foreign Application Priority Data

Jul. 29, 2002 (JP) ........................................ 2002-219237

(51) Int. Cl.[7] .............................................. H03F 3/66
(52) U.S. Cl. .......................................... 330/52; 330/151
(58) Field of Search .......................... 330/52, 151, 149; 375/297; 455/63

(56) References Cited

U.S. PATENT DOCUMENTS 6,414,546 B2 * 7/2002 Cavers ....................... 330/149
6,424,214 B2 * 7/2002 Sera et al. .................. 330/151
6,727,751 B2 * 4/2004 Yonenaga et al. .......... 330/151

\* cited by examiner

*Primary Examiner*—Henry Choe
(74) *Attorney, Agent, or Firm*—Wenderoth, Lind & Ponack, L.L.P.

(57) ABSTRACT

The object of this invention is to provide a feedforward amplifier that performs precise distortion compensation on a plurality of signal groups without adopting broadband frequency-band characteristics for the auxiliary amplifier. This is achieved by inputting a plurality of signal groups, each having a different frequency bandwidth respectively. In a distortion detection loop, a main amplifier 4 is used to amplify this plurality of input signal groups and detect the distortion arising in said main amplifier 4. In a distortion compensation loop the distortion detected in the distortion detection loop is removed from the amplified signal from said main amplifier 4. At this time, the distortion compensation loop has the same number of distortion amplification systems as the number of input signal groups that use the auxiliary amplifiers 12 and 16 to amplify distortion in each input signal group that contains distortion detected by the distortion detection loop, and that removes the sum total of the distortion of each input signal group amplified by this plurality of distortion amplification systems from the amplified signal from the main amplifier 4.

20 Claims, 3 Drawing Sheets

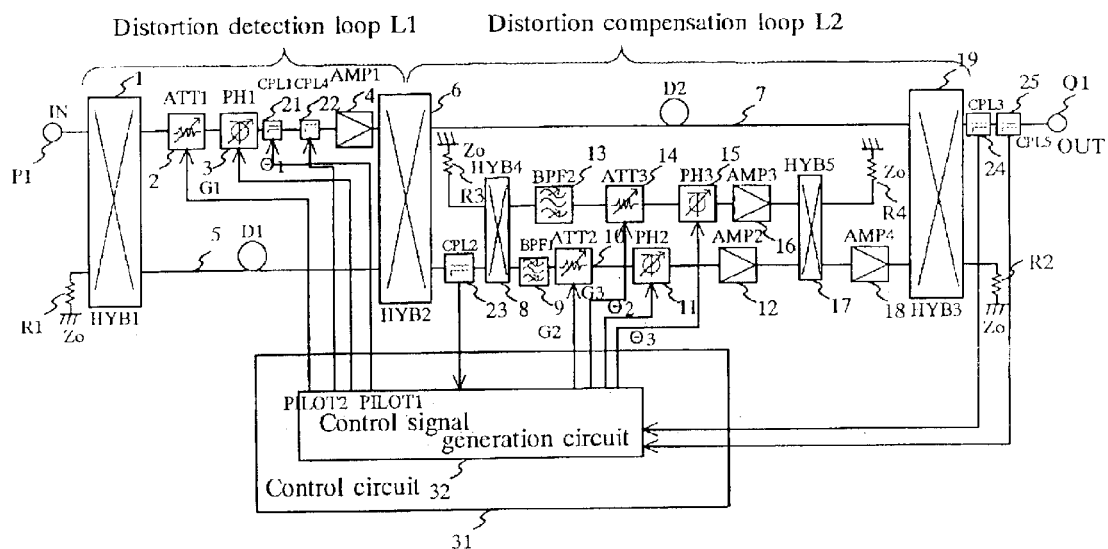
(Fig.1)

Case of PCS and W-CDMA (a) During input

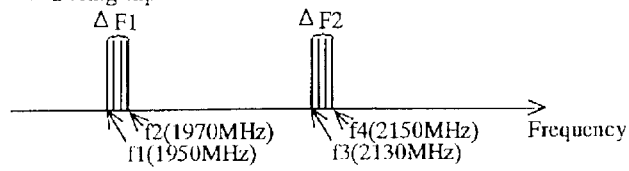

(b) AMP1(Distortion arises in the respective bands.)

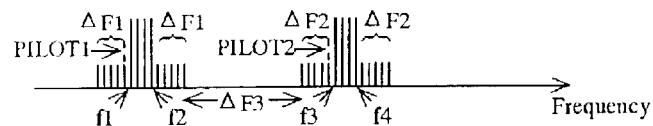

(c) CPL2(Distortion components are extracted.)

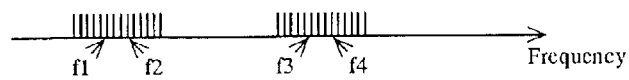

(d) AMP2(The distortion in only the first input signal group is amplified.)

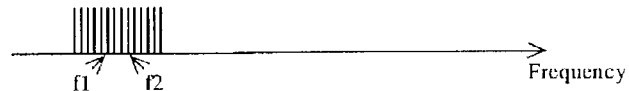

(e) AMP3(The distortion in only the second input signal group is amplified.)

(f) AMP4(The distortion in the input signal groups is amplified.)

(g) OUT(The distortion arising in AMP1 is compensated for with the distortion of AMP4.)

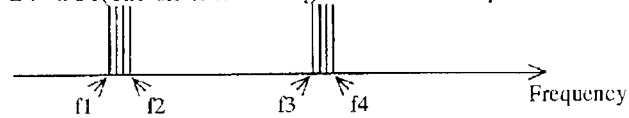

(Fig.2)

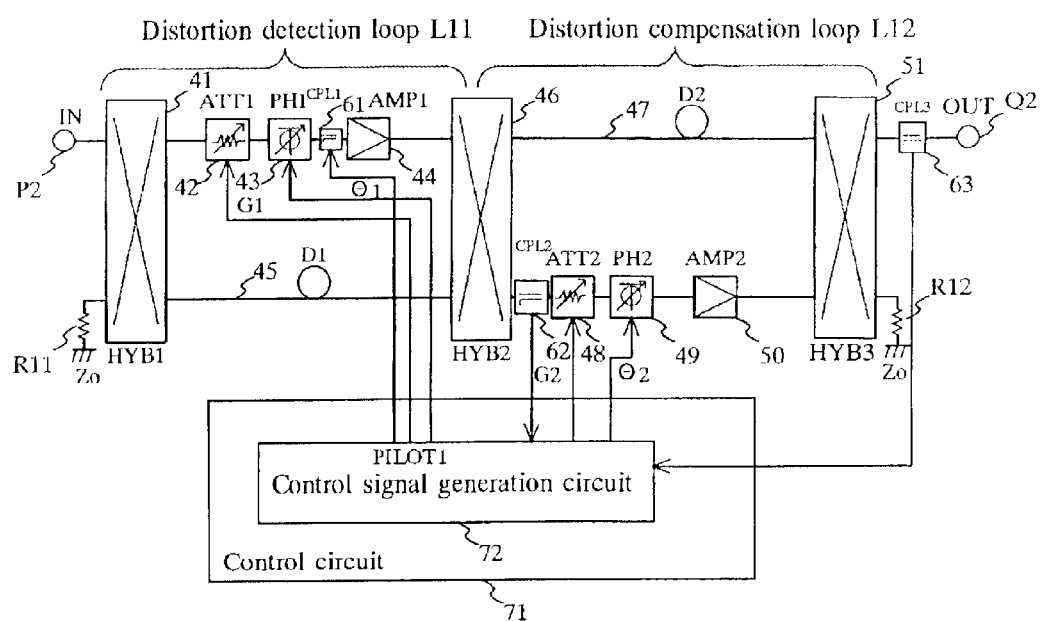
(Fig.3)

FEEDFORWARD AMPLIFIER

BACKGROUND OF THE INVENTION

1. Field of the Invention

This invention relates to a feedforward amplifier that, in a distortion detection loop, uses a main amplifier to amplify a plurality of signal groups wherein each has a different frequency band, and in a distortion compensation loop, also compensates for the distortion that arises in said main amplifier and particularly to a feedforward amplifier that is able to perform precise distortion compensation on a plurality of wideband signal groups as a whole without adopting broadband frequency-band characteristics for the auxiliary amplifier used to amplify the distortion detected by the distortion detection loop.

2. Description of the Prior Art

For example, in base station units and relay station units used for mobile communications, a multi-carrier signal that contains a plurality of carriers at stipulated frequency intervals that are each modulated appropriately is transmitted wirelessly after high-frequency amplification. Unless the amplifier used for high-frequency amplification has sufficient linearity, various kinds of distortion including intermodulation distortion and the like may occur. This distortion becomes an impediment to achieving normal and high-quality communication. For this reason, the amplifiers used for the amplification of multi-carrier signals are required to have good linearity over the entire frequency band to which the multi-carrier signal belongs.

One example of a method of achieving an ultra-low-distortion amplifier suited to the amplification of a multi-carrier signal is the feedforward (FF) amplification scheme.

Here in this Specification, within the FF amplification scheme, the signal path from the signal input terminal via the main amplifier to the signal output terminal, namely the signal path for conveying the signal to be amplified and the amplified signal is referred to as the "main line."

In addition, in the FF amplification scheme, a distortion detection path that couples a signal branching from a point after the main amplifier in the main line to a signal branching from a point before the main amplifier in the main line. In this Specification, the loop consisting of the main line and the distortion detection path is called the distortion detection loop.

Moreover, in the distortion detection loop, the electrical lengths of the signal paths over which both the signal conveyed along the main line and the signal conveyed along the distortion detection path are equal to each other, and, if both signals have mutually opposite phases at the same amplitude, then with the aforementioned signal coupling action, it is possible to cancel the carrier-wave components and extract a signal equivalent to the distortion arising in the main amplifier and its peripheral circuits.

Moreover, in the FF amplification scheme, a distortion compensation path is provided to recouple the signal extracted by the distortion detection loop, namely a signal equivalent to the distortion, to the signal on the main line. In this Specification, the loop consisting of the main line and the distortion compensation loop is called the distortion compensation loop.

Moreover, signal delay in the distortion compensation loop is compensated for in the main line and as long as adjustment of the amplitude and phase is performed appropriately in the distortion compensation loop so that the distortion components contained in the signal on the main line have the same amplitude and the opposite phase from the distortion signal obtained from the distortion compensation loop, it is possible to compensate for the distortion occurring in the main amplifier.

FIG. 3 shows an example of the constitution of a conventional FF amplifier.

In the FF amplifier shown in the figure, three directional couplers (hybrid) 41, 46 and 51 are utilized to form a distortion detection loop L11 consisting of the main line and the distortion detection path and a distortion compensation loop L12 consisting of the main line and the distortion compensation path.

Specifically, the signal path from the signal input terminal P2 via the first directional coupler 41, first variable attenuator 42, first variable phase shifter 43, first coupler 61, main amplifier (first amplifier) 44, second directional coupler 46, second coaxial delay line 47, third directional coupler 51 and third coupler 63 to the signal output terminal Q2 is equivalent to the main line.

In addition, the signal path from the signal input terminal P2 via the first directional coupler 41 and first coaxial delay line 45 to the output terminal of the second directional coupler 46 is equivalent to the distortion detection path.

In addition, the signal path from the output terminal of the second directional coupler 46 via the second coupler 62, second variable attenuator 48, second variable phase shifter 49 and auxiliary amplifier (second amplifier) 50 to the output terminal of the third directional coupler 51 is equivalent to the distortion compensation path.

Note that the terminating resistors R11 and R12 are connected to one input terminal of the first directional coupler 41 and one output terminal of the third directional coupler 51 as terminating dummy loads. These terminating resistors R11 and R12 have an impedance of $Z_0$ equal to the characteristic impedance of the path.

In addition, with the FF amplifier shown in the figure, the three couplers 61, 62 and 63 and a control circuit 71 which has a control signal generation circuit 72 constitute the feedback control system which performs control using pilot signals and the like.

Here follows one example of the operation performed by the FF amplifier shown in the figure.

For example, when a multi-carrier signal is applied to the signal input terminal P2, this signal is input via the first directional coupler 41 to the first variable attenuator 42 and first variable phase shifter 43, where its amplitude and phase are adjusted, and then further input to the main amplifier 44 where it is amplified. The signal amplified by the main amplifier 44 is input via the second directional coupler 46 and second coaxial delay line 47 to the third directional coupler 51, and further output from the third directional coupler 51 via the signal output terminal Q2 to the circuits after this FF amplifier. Note that the second coaxial delay line 47 is a delay line that compensates for the signal delay arising in the circuit constituting the distortion compensation loop L12, e.g., the auxiliary amplifier 50.

In addition, the signal input from the signal input terminal P2 is divided into two branches by the first directional coupler 41. The two branches of the signal are the same signal from the standpoint of the constitution of component frequencies, and the signal branch supplied to the main line side is amplified by the main amplifier 44, while the signal branch supplied to the distortion detection path side is supplied at roughly its original amplitude from the first directional coupler 41 via the first coaxial delay line 45 to the second directional coupler 46. Note that the first coaxial delay line 45 is a delay line for compensating for the signal delay arising in the main amplifier 44 in particular.

The signal supplied via the first coaxial delay line 45 to the second directional coupler 46 is coupled by this second directional coupler 46 to the amplified signal that contains distortion components.

Specifically, the second directional coupler 46 divides the signal containing distortion components output from the main amplifier 44 into two branches. The two branches of the signal are the same signal from the standpoint of the constitution of component frequencies; one signal branch is supplied to the main line side while the other signal branch is supplied to the distortion compensation path side When this other signal branch is supplied to the distortion compensation path side, the second directional coupler 46 couples this other signal branch to the signal input via the first coaxial delay line 45, thereby canceling the carrier-wave components within the other signal branch and extracting the distortion components from this other signal branch.

The distortion signal obtained as a result of this coupling is supplied from the second directional coupler 46 to the second variable attenuator 48, second variable phase shifter 49 and auxiliary amplifier 50 which constitute the distortion compensation path, its amplitude and phase are adjusted in the second variable attenuator 48 and second variable phase shifter 49, and moreover it is amplified by the auxiliary amplifier 50 and provided as input to the third directional coupler 51. The distortion signal input to the third directional coupler 51 is coupled in the third directional coupler 51 to the signal input via the second coaxial delay line 47, the distortion contained within this signal is cancelled and this signal with the distortion cancelled is output from signal output terminal Q2.

Here, in order to extract the distortion arising in the main amplifier 44 or the like by coupling the signal branch of the output signal from the main amplifier 44 to the signal traveling via the first coaxial delay line 45 in the second directional coupler 46, a stipulated number of carrier-wave components contained in the signal branch of the output signal from the main amplifier 44 and the same number of carrier-wave components contained in the signal via the first coaxial delay line 45 are necessary at the time of coupling in the second directional coupler 46 at the same timing, same amplitude and opposite phase from each other.

The first coaxial delay line 45 is a means of applying the delay time $D_1$ to the signal and synchronizing the timing among the carrier-wave components. In addition, the first variable attenuator 42, first variable phase shifter 43 and the control circuit 71 which exerts control so as to adjust the signal attenuation $G_1$ in the first variable attenuator 42 and the signal phase shift $\theta_1$ in the first variable phase shifter 43 to optimal values are the means of bringing the carrier wave components to the same amplitude and opposite phase.

In this manner, the first coaxial delay line 45, first variable attenuator 42, first variable phase shifter 43 and control circuit 71 are means of adjusting the output from the second directional coupler 46 so that a signal containing only distortion components and containing no carrier-wave components is supplied to the auxiliary amplifier 50.

In addition, in order to compensate for distortion by coupling in the third directional coupler 51 the signal coming via the second coaxial delay line 47 to the signal coming via the auxiliary amplifier 50, it is preferable that, firstly, the signal coming via the auxiliary amplifier 50 be a signal that contains only distortion components and contains no carrier-wave components. Here, the generation of distortion in the auxiliary amplifier 50 is negligible when the distortion detection loop L11 is operating normally, so it is possible to set an appropriate value for the delay time $D_1$ of the first coaxial delay line 45 and also have the control circuit 71 appropriately control the first variable attenuator 42 and first variable phase shifter 43 to satisfy this first condition.

In addition, in order to compensate for distortion in the third directional coupler 51, secondly, the distortion components within the signal coming via the second coaxial delay line 47 and the distortion components within the signal coming via the auxiliary amplifier 50 are necessary at the time of coupling in the third directional coupler 51 at the same timing, same amplitude and opposite phase from each other.

The second coaxial delay line 47 is a means of applying the delay time $D_2$ to the signal and synchronizing the timing among the carrier-wave components. In addition, the second variable attenuator 48, second variable phase shifter 49, and the control circuit 71 which exerts control so as to adjust the signal attenuation $G_2$ in the second variable attenuator 48 and the signal phase shift $\theta_2$ in the second variable phase shifter 49 to optimal values are the means of bringing the carrier wave components to the same amplitude and opposite phase.

Note that the process of exerting control so as to adjust the first signal attenuation $G_1$ and first signal phase shift $\theta_1$ and the second signal attenuation $G_2$ and signal phase shift $\theta_2$ to optimal values, namely the process of optimizing the state of the distortion detection loop L11 and distortion compensation loop L12 is executed by the control circuit 71. In the FF amplifier shown in the figure, this optimization process is executed by the control circuit 71 which operates under the control of a central processing unit (CPU).

Specifically, the second coupler 62 detects a portion of the output of the second directional coupler 46 to the distortion compensation path, and outputs the results of this detection to the control signal generation circuit 72 of the control circuit 71. Then, the control signal generation circuit 72 controls the first signal attenuation $G_1$ of the first variable attenuator 42 and the first signal phase shift $\theta_1$ of the first variable phase shifter 43 so that only the distortion generated by the second coupler 62 is detected.

In addition, the control signal generation circuit 72 of the control circuit 71 generates a stipulated pilot signal and outputs this pilot signal to the first coupler 61. The first coupler 61 combines this pilot signal with the output from the first variable phase shifter 43 and outputs this composite signal to the main amplifier 44. In addition, the third coupler 63 detects the components of the pilot signal inserted into the input signal subject to amplification with the first coupler 61 and outputs the results of this detection to the control signal generation circuit 72 of the control circuit 71. Based on the results of detection input from the third coupler 63, the control signal generation circuit 72 controls the signal attenuation $G_2$ of the second variable attenuator 48 and the signal phase shift $\theta_2$ of the second variable phase shifter 49, thereby achieving good compensation of distortion.

However, with the conventional FF amplifier as shown in FIG. 3 above, when processing a group of signals having a plurality of different frequency bands such as in a multi-carrier signal, there was a problem in that it was necessary to adopt broadband frequency-band characteristics for the auxiliary amplifier 50. Specifically, it is difficult to obtain a flat broadband response for the amplification characteristics and phase characteristics at the time of amplification with the auxiliary amplifier 50, for example.

The present invention came about in light of the aforementioned circumstances and has as its object to provide a feedforward amplifier that has a distortion detection loop and a distortion compensation loop, and that uses a main amplifier to amplify a plurality of signal groups wherein each has a different frequency band, and in a constitution wherein the distortion arising in this main amplifier is compensated for, it is able to perform precise distortion compensation on a plurality of wideband signal groups as a whole without adopting broadband frequency-band characteristics for the auxiliary amplifier used to amplify the distortion detected by the distortion detection loop.

Note that in an example of the prior art, the "feedforward amplifier" recited in the publication of unexamined Japanese patent application (Kokai) No. JP-A-2000-236222 (hereinafter referred to as "Reference Document 1"), broadband characteristics are adopted through the parallel operation of a first auxiliary amplifier that amplifies the distortion components arising on the side of the frequency band lower than the channel band of the input signal, and a second auxiliary amplifier that amplifies the distortion components arising on the side of the frequency band higher than the channel band of the input signal.

Here, upon comparing the prior art recited in Reference Document 1 against the present invention to be presented hereinafter, for example, while the prior art in question has a constitution whereby distortion components in the upside frequency band and distortion components in the downside frequency band arising in an input signal (the signal of one carrier) having a contiguous frequency band are amplified using different auxiliary amplifiers, the present invention differs on the point that its constitution is such that distortion is amplified by a different auxiliary amplifier for each of the various input signal groups arising when input signal groups (e.g., multi-carrier signals) have a plurality of different frequency bands.

SUMMARY OF THE INVENTION

In order to achieve the aforementioned object, with the feedforward amplifier according to the present invention, a plurality of groups of signals having different frequency bands are input, a plurality of input signal groups are amplified with a main amplifier in a distortion detection loop and the distortion arising in this main amplifier is detected, and in a distortion compensation loop the distortion detected by the distortion detection loop is removed from the signal amplified by this main amplifier, and at this time, the distortion compensation loop is constituted as follows.

To wit, the distortion compensation loop has the same number of distortion amplification systems as the number of input signal groups, and each distortion amplification system uses an auxiliary amplifier to amplify the distortion for each input signal group that is included in the distortion detected by the distortion detection loop. Moreover, the distortion compensation loop removes the sum total of the distortion from each input signal group amplified by this plurality (to wit, the same number as the number of input signal groups) of distortion amplification systems from the amplified signal from the main amplifier.

Accordingly, the distortion compensation loop is provided with input signal groups corresponding to each input signal group and the same number of distortion amplification systems, and the distortion of each input signal group is amplified by the auxiliary amplifier of each distortion amplification system, so for example, even without adopting broadband frequency band characteristics for the auxiliary amplifiers used to amplify the distortion detected by the distortion detection loop, to wit, even without adopting broadband frequency band characteristics for the auxiliary amplifiers of each distortion amplification system, it is possible to perform precise distortion compensation for the plurality of input signal groups.

Here, the plurality of signal groups each has a different frequency band, and various frequency bands may be used as the frequency bands of each of the signal groups. As a specific example, mutually separated frequency bands may be used as the frequency bands of each signal group.

Various numbers may be used as the number of the plurality of signal groups.

In addition, each of the signal groups may have a frequency bandwidth, for example. Note that a signal with one frequency, for example, may also be used as a signal group according to the present invention, and the present invention also encompasses such an embodiment.

In addition, various compositions may be used as the composition of the distortion detection loop and the composition of the distortion removal loop.

In addition, various amplifiers may be used as the main amplifier. Specific examples of the main amplifier include a common amplifier that is able to amplify signals of a plurality of frequencies all at once.

In addition, the distortion detected by the distortion detection loop includes distortion for each of the respective signal groups, to wit, the distortion arising due to the amplification of the respective signal groups by the main amplifier.

In addition, distortion for each input signal group may include, for example, tertiary distortion arising in the frequency band on the upside (high-frequency side) of each of these input signal groups (upside tertiary distortion), tertiary distortion arising in the frequency band on the downside (low-frequency side) of each of these input signal groups (downside tertiary distortion), etc.

In addition, various degrees of precision may be used as the precision of removal of distortion from the amplified signal from the main amplifier in the distortion compensation loop as long as they are practically effective, to wit, various degrees of precision may be used as the precision of distortion compensation performed in the distortion compensation loop as long as they are practically effective.

In addition, various amplifiers may be used as the auxiliary amplifiers. Specific examples include amplifiers that have characteristics that are good for the amplification of signals in the frequency bands of distortion subject to amplification by each when used as the auxiliary amplifiers for the distortion amplification systems, and even more specific examples include amplifiers wherein the amplitude characteristics and phase characteristics are flat during amplification over the frequency bands of distortion subject to amplification by each.

In addition, the distortion amplification systems used may be ones of various constitutions.

In addition, the sum total of the distortion for each input signal group amplified by all of the distortion amplification systems may be removed from the amplified signal from the main amplifier, or the distortion arising in the main amplifier for all of the input signal groups may be removed from this amplified signal.

Note that in one sample constitution, the distortion compensation loop comprises division means consisting of a divider, for example, that divides the distortion detected by the distortion detection loop among each of the distortion amplification systems, and combining means consisting of a combiner, for example, that obtains the sum total of distortion in each input signal group amplified by the auxiliary amplifier of each distortion amplification system.

In addition, with the feedforward amplifier according to the present invention, as one sample constitution, the distortion amplification systems that have distortion compensation loops are provided with filters that extract the distortion in the input signal groups corresponding to each, and the distortion extracted by these filters is amplified by auxiliary amplifiers.

Accordingly, in each distortion amplification system, the distortion in each input signal group subject to amplification can be extracted by the filter to remove any unnecessary frequency components.

Here, various filters may be used as the filters.

In addition, as specific examples, filters having such characteristics that they extract signals in the frequency band of distortion subject to amplification by the respective distortion amplification systems and in the frequency band of the input signal group corresponding to this distortion may be used as the filters of the respective distortion amplification systems.

In addition, with the feedforward amplifier according to the present invention, as one sample constitution, the various distortion amplification systems having distortion compensation loops are constituted as follows.

To wit, with the various distortion amplification systems having distortion compensation loops, a bandpass filter extracts the distortion in the corresponding respective input signal group, an amplitude changer changes the amplitude of the distortion extracted by the bandpass filter, a phase changer changes the phase of the distortion extracted by the bandpass filter and an auxiliary amplifier amplifies the distortion after its amplitude is changed by the amplitude changer and its phase is changed by the phase changer.

Accordingly, in the various distortion amplification systems, it is possible to exert control by which the amplitude and phase of this distortion is changed at the time of amplification of the respective corresponding input signal groups by the auxiliary amplifiers.

Here, as the mode of changing the amplitude of the distortion, for example, a mode of attenuating the distortion to decrease the amplitude of said distortion, or a mode of amplifying the distortion to increase the amplitude of said distortion may be used.

In addition, a variable attenuator that has the function of attenuating the signal with a variable attenuation, or a variable amplifier that has the function of amplifying the signal with a variable amplification, for example, may be used as the amplitude changer.

In addition, a variable phase shifter that has the function of changing the phase of the signal with a variable amount of phase shift, for example, may be used as the phase changer.

In addition, the order of using the amplitude changer to change amplitude of the distortion and using the phase changer to change the phase of the distortion may be arbitrary. Specifically, a mode wherein the phase of the distortion is changed after changing the amplitude of the distortion may be used, or a mode wherein the amplitude of the distortion is changed after changing the phase of the distortion may be used. Note that at the time of changing the amplitude or phase of the distortion, there may be cases wherein only the amplitude of the distortion is changed, cases wherein only the phase of the distortion is changed, or cases wherein neither the amplitude nor the phase of the distortion is changed.

In addition, with the feedforward amplifier according to the present invention, as one sample constitution, bandpass filters that have flat delay and flat amplification in the frequency band of the extracted distortion is used as the bandpass filter provided in the distortion amplification systems that have distortion compensation loops.

Accordingly, it is possible to maintain the flat delay and flat amplification in filtering by the bandpass filters of each distortion amplification system.

Here, "flat delay in the frequency band of the extracted distortion" is defined to be a characteristic wherein the delay arising over the entire range of distortion is the same or on the same level when distortion is extracted in said frequency band.

In addition, "flat amplification in the frequency band of the extracted distortion" is defined to be a characteristic wherein the amplification arising over the entire range of distortion is the same or on the same level when distortion is extracted in said frequency band.

In addition, with the feedforward amplifier according to the present invention, as one sample constitution, control is exerted using pilot signals as follows.

To wit, pilot signals are provided for each of the input signal groups, and in this constitution, the number of pilot signals is the same as the number of input signal groups. Moreover, pilot signal synthesizing means is provided for each input signal group for the plurality of input signal groups prior to amplification by the main amplifier provided in the distortion detection loop, and synthesizes the same number of pilot signals as the number of input signal groups. Pilot signal corresponding signal detection means detects signals corresponding to each pilot signal contained within the amplified signal from the main amplifier from which distortion is removed by the distortion compensation loop. Pilot signal control means controls each of the distortion amplification systems having distortion compensation loops based on the results of detection by the pilot signal corresponding signal detection means so that the distortion contained in the amplified signal from the main amplifier with distortion removed by the distortion compensation loop is reduced.

Accordingly, the distortion amplification system corresponding to each of the respective input signal groups is controlled based on pilot signals corresponding to the each of the respective input signal groups, so the distortion contained in the amplified signal from the main amplifier with distortion removed is reduced, so it is possible to perform precise distortion compensation for each input signal group. Note that the distortion contained in the amplified signal from the main amplifier from which distortion is removed is equivalent to the residual distortion not removed by this distortion removal.

Here, as the mode of synthesizing pilot signals for the plurality of input signal groups prior to being amplified by the main amplifier, a mode of synthesizing the pilot signals for the plurality of input signal groups immediately prior to the main amplifier, for example, may be used, or another mode may also be used.

In addition, signals having various frequencies may be used as the pilot signals for each input signal group; it is preferable to use signals having frequencies on the inside of the distortion frequency band of the input signal groups in question, or frequencies nearby on the outside, for example, and it is preferable to use signals having frequencies different from the frequencies constituting the distortion in the input signal groups, for example.

In addition, various signals may be used as the pilot signals.

In addition, as the pilot signal synthesizing means, one that synthesizes pilot signals individually for each input signal group may be used, or one that synthesizes pilot signals for a plurality of input signal groups altogether may also be used.

In addition, as signals corresponding to the pilot signals detected by the pilot signal corresponding signal detection means, signals having the same frequency as the frequency of the various pilot signals, for example, are detected.

In addition, as the pilot signal corresponding signal detection means, one that detects the signals corresponding to each pilot signal individually may be used, or one that detects signals corresponding to a plurality of pilot signals altogether may also be used.

In addition, as the mode of exerting control in order to reduce the distortion contained in the amplified signal from the main amplifier from which distortion is removed by the distortion compensation loop, it is possible to use a mode of control such that the level of the signal detected by the pilot signal corresponding signal detection means becomes small, for example, or it is more preferable to use a mode of control such that the level of this signal is minimized.

In addition, as the mode of controlling the various distortion amplification systems having distortion compensation loops, it is possible to use a mode such that the change in amplification of the amplification changer or the phase change of the phase changer is controlled with respect to the amplification changer or phase changer provided in each distortion amplification system, for example.

In addition, the feedforward amplifier according to the present invention as described above is suitable for use in base station units and relay station units provided in cellular phone systems or Personal Handy phone Systems (PHS) or other mobile communications systems.

As one example, with the base station unit according to the present invention, a feedforward amplifier such as that described above is provided, and multi-carrier or other signals for the mobile station units serving as the other party in communications are amplified by this feedforward amplifier and compensation for the distortion arising at the time of this amplification is performed, and then the amplified signal is transmitted wirelessly to the other party.

Here, various constitutions may be used for the constitution of the mobile communications system, base station unit, relay station unit, mobile station unit or the like.

In addition, various communication protocols can be used as the communication protocol; for example, Code Division Multiple Access (CDMA), Time Division Multiple Access (TDMA), Frequency Division Multiple Access (FDMA) or other communications protocols may be used.

BRIEF EXPLANATION OF THE DRAWINGS

FIG. 1 is a diagram of an example of a feedforward amplifier according to a preferred embodiment of the present invention.

FIG. 2 is a diagram used to describe an example of the signal processing performed by means of the feedforward amplifier according to a preferred embodiment of the present invention.

FIG. 3 is a diagram of an example of a feedforward amplifier according to the prior art.

DESCRIPTION OF THE PREFERRED EMBODIMENTS

Here follows a description of a preferred embodiment of the present invention made with reference to the figures.

FIG. 1 shows an example of a feedforward amplifier (FF amplifier) according to the present invention. The FF amplifier in this example is used in the base station unit of a mobile communications system, and uses a main amplifier to amplify a multi-carrier signal subject to wireless transmission by this base station unit, and then compensates for the distortion generated at the time of this amplification. In addition, this example illustrates the case in which the multi-carrier signal input to the FF amplifier in this example consists of two signal groups (the first input signal group and the second input signal group) which have different frequency bandwidths and these frequency bandwidths are separated from each other.

In the FF amplifier of this embodiment, three directional couplers (hybrid) 1, 6 and 19 are provided between the signal input terminal P1 and the signal output terminal Q1.

In addition, between the first directional coupler 1 and the second directional coupler 6 are a first variable attenuator 2, first variable phase shifter 3, first coupler 21, fourth coupler 22 and a main amplifier (first amplifier) 4 provided along one line, and a first coaxial delay line 5 provided along the other line.

Between the second directional coupler 6 and the third directional coupler 19 are a second coaxial delay line 7 provided along one line and a second coupler 23, fourth variable phase shifter 8, two distortion amplification systems (the first distortion amplification system and the second distortion amplification system), a fifth directional coupler 17 and a distortion amplifier (fourth amplifier) 18 provided along the other line.

The first distortion amplification system is provided with a first bandpass filter (BPF) 9, second variable attenuator 10, second variable phase shifter 11 and an auxiliary amplifier (second amplifier) 12, while the second distortion amplification system is provided with a second bandpass filter 13, third variable attenuator 14, third variable phase shifter 15 and an auxiliary amplifier (second amplifier) 16.

In addition, between the third directional coupler 19 and the signal output terminal Q1 are provided a third coupler 24 and a fifth coupler 25.

Note that the terminating resistors R1 through R4 are connected to one input terminal of the first directional coupler 1, one output terminal of the third directional coupler 19, one input terminal of the fourth variable phase shifter 8, and one output terminal of the fifth directional coupler 17 as terminating dummy loads. These terminating resistors R1 through R4 have an impedance of $Z_0$ equal to the characteristic impedance of the path.

In addition, with the FF amplifier in this example, the couplers 21 through 25 and a control circuit 31 which has a control signal generation circuit 372 constitute the feedback control system which performs control using pilot signals and the like.

In the FF amplifier according to this embodiment, the aforementioned one line between the first directional coupler 1 and the second directional coupler 6, and the aforementioned other lie between the second directional coupler 6 and the third directional coupler 19 constitute the main line; the aforementioned other line between the first directional coupler 1 and second directional coupler 6 constitutes the distortion detection path; and the aforementioned other line between the second directional coupler 6 and the third directional coupler 19 constitute the distortion compensation path. In addition, the loop consisting of the aforementioned one line (main line) between the first directional coupler 1 and the second directional coupler 6 and the distortion detection path forms the distortion detection loop L1, while the loop consisting of the aforementioned one line (main line) between the second directional coupler 6 and the third directional coupler 19 and the distortion compensation path forms the distortion compensation loop L2.

Here, the constitution and operation of the FF amplifier according to the present embodiment are identical to the constitution and operation of the FF amplifier shown in FIG. 3 above with the exception of the fact that a plurality of distortion amplification systems are provided in the distortion compensation loop L2, and the couplers 21, 22, 24 and 25 are provided corresponding to the plurality of pilot signals.

For this reason, we shall describe in detail only the constitution and operation that differ from those of the FF amplifier shown in FIG. 3.

Here follows a description of the operation performed by the FF amplifier according to this embodiment.

Note that the operation of the couplers 21 through 25 will be described altogether later.

First, the operation of inputting a signal from the signal input terminal P1 and using the distortion detection loop L1 to detect the distortion arising in the main amplifier 4 is identical to that in the case of the FF amplifier shown in FIG. 3 above.

In addition, the operation on the main line side via the second coaxial delay line 7 provided between the second directional coupler 6 and the third directional coupler 19 is also identical to that in the case of the FF amplifier shown in FIG. 3 above.

The distortion component signal extracted by the second directional coupler 6 is sent to the fourth variable phase shifter 8. The fourth variable phase shifter 8 divides the input distortion component signal into two branches, so one signal branch is output to the first bandpass filter 9 of the first distortion amplification system, while the other signal branch is output to the second bandpass filter 13 of the second distortion amplification system.

In the first distortion amplification system, the one signal branch thus supplied is filtered by the first bandpass filter 9 to extract only the frequency band of the first input signal group contained in the aforementioned one branch signal and the frequency band of the distortion generated in the main amplifier 4 due to the first input signal group, and this extracted signal (called the first extracted signal) is output to the second variable attenuator 10. Then, the first extracted signal thus extracted is attenuated by the second variable attenuator 10, has its phase changed by the second variable phase shifter 11, and is amplified by the auxiliary amplifier 12 and output to the fifth directional coupler 17. In this manner, in the first distortion amplification system, only the first input signal group and the distortion generated in the main amplifier 4 due to the first input signal group is extracted by the first bandpass filter 9 and amplified and the like.

Similarly, in the second distortion amplification system, the other signal branch thus supplied is filtered by the second bandpass filter 13 to extract only the frequency band of the second input signal group contained in the aforementioned other branch signal and the frequency band of the distortion generated in the main amplifier 4 due to the second input signal group, and this extracted signal (called the second extracted signal) is output to the third variable attenuator 14. Then, the second extracted signal thus extracted is attenuated by the third variable attenuator 14, has its phase changed by the third variable phase shifter 15, and is amplified by the auxiliary amplifier 16 and is output to the fifth directional coupler 17. In this manner, in the second distortion amplification system, only the second input signal group and the distortion generated in the main amplifier 4 due to the second input signal group is extracted by the second bandpass filter 13 and amplified and the like.

The fifth directional coupler 17 couples the signal input from the auxiliary amplifier 12 of the first distortion amplification system to the signal input from the auxiliary amplifier 16 of the second distortion amplification system, and outputs the results of this coupling to the distortion amplifier 18. The distortion amplifier 18 amplifies the coupled signal thus input and outputs it to the third directional coupler 19. The third directional coupler 19 removes from the signal input via the second coaxial delay line 7 the distortion signal input via the distortion amplifier 18 through the second distortion amplification system, and outputs the signal with this distortion signal removed.

In this manner, with the FF amplifier according to this embodiment, the distortion of the first input signal group is extracted and amplified and the like by the first distortion amplification system and then removed from the signal on the main line side by the third directional coupler 19, and also, the distortion of the second input signal group is extracted and amplified and the like by the second distortion amplification system and then removed from the signal on the main line side by the third directional coupler 19.

Here, the second variable attenuator 10 receives control signals from the control signal generation circuit 32 of the control circuit 31 and thus varies the signal attenuation $G_2$ based on these control signals.

In addition, the second variable phase shifter 11 receives control signals from the control signal generation circuit 32 of the control circuit 31 and thus varies the signal phase shift $\theta_2$ based on these control signals.

Similarly, the third variable attenuator 14 receives control signals from the control signal generation circuit 32 of the control circuit 31 and thus varies the signal attenuation $G_3$ based on these control signals.

In addition, the third variable phase shifter 15 receives control signals from the control signal generation circuit 32 of the control circuit 31 and thus varies the signal phase shift $\theta_3$ based on these control signals.

Moreover, at the point in time when the distortion signal of the first input signal group contained in the signal traveling via the second coaxial delay line 7 and the distortion signal of the first input signal group traveling via the first distortion amplification system and the fifth directional coupler 17 and distortion amplifier 18 are coupled in the third directional coupler 19, in order for them to be given the same delay (same timing), same amplitude and opposite phase, the control circuit 31 adjusts the second signal attenuation $G_2$ of the second variable attenuator 10 and the signal phase shift $\theta_2$ of the second variable phase shifter 11.

Similarly, at the point in time when the distortion signal of the second input signal group contained in the signal traveling via the second coaxial delay line 7 and the distortion signal of the second input signal group traveling via the second distortion amplification system and the fifth directional coupler 17 and distortion amplifier 18 are coupled in the third directional coupler 19, in order for them to be given the same delay (same timing), same amplitude and opposite phase, the control circuit 31 adjusts the signal attenuation $G_3$ of the third variable attenuator 14 and the signal phase shift $\theta_3$ of the third variable phase shifter 15.

Note that the first bandpass filter 9 provided in the first distortion amplification system and the second bandpass filter 13 provided in the second distortion amplification system preferably have a flat delay characteristic and flat amplitude characteristic, and thus it is possible to prevent disturbance in the phase or amplitude of the processed signals or deterioration in the precision of distortion compensation.

In this manner, with the FF amplifier according to this embodiment, it is possible to perform distortion compensation in the first input signal group extracted by the first bandpass filter 9 provided in the first distortion amplification system and its distortion frequency bandwidth, and also, it is possible to perform distortion compensation in the second input signal group extracted by the second bandpass filter 13 provided in the second distortion amplification system and its distortion frequency bandwidth. Accordingly, with the FF amplifier according to this embodiment, it is possible to perform distortion compensation over a wider band than that of the conventional FF amplifier shown in FIG. 3 above.

Here follows a description of the operation of the couplers 21 through 25 provided in the FF amplifier according to this embodiment.

The second coupler 23 detects a portion of the output from the second directional coupler 6 to the distortion compensation path, and outputs the results of this detection to the control signal generation circuit 32 of the control circuit 31. Moreover, the control signal generation circuit 32 controls the first signal attenuation $G_1$ of the first variable attenuator 2 and the first signal phase shift $\theta_1$ of the first variable phase shifter 3 so that only the distortion arising in the main amplifier 4 is detected by the second coupler 23. Note that in this embodiment, the distortion arising in the main amplifier 4 includes the distortion due to the first input signal group and the distortion due to the second input signal group.

In addition, the control signal generation circuit 32 of the control circuit 31 generates the stipulated first pilot signal corresponding to the first input signal group and outputs this first pilot signal to the first coupler 21. The first coupler 21 combines this pilot signal with the output from the first variable phase shifter 3 and outputs this composite signal to the second coupler 22.

Similarly, the control signal generation circuit 32 of the control circuit 31 generates the stipulated second pilot signal corresponding to the second input signal group and outputs this second pilot signal to the fourth coupler 22. The fourth coupler 22 combines this pilot signal with the output from the first coupler 21 and outputs this composite signal to the main amplifier 4.

In addition, the third coupler 24 detects the components of the first pilot signal inserted into the input signal subject to amplification by the first coupler 21, and outputs the results of this detection to the control signal generation circuit 32 of the control circuit 31. Based on the results of detection input from the third coupler 24, the control signal generation circuit 32 controls the second signal attenuation $G_2$ of the second variable attenuator 10 and the signal phase shift $\theta_2$ of the second variable phase shifter 11 provided in the first distortion amplification system corresponding to the first input signal group, and thereby achieves good distortion compensation with respect to the distortion of the first input signal group.

Similarly, the fifth coupler 25 detects the components of the second pilot signal inserted into the input signal subject to amplification by the fourth coupler 22, and outputs the results of this detection to the control signal generation circuit 32 of the control circuit 31. Based on the results of detection input from the fifth coupler 25, the control signal generation circuit 32 controls the signal attenuation $G_3$ of the third variable attenuator 14 and the signal phase shift $\theta_3$ of the third variable phase shifter 15 provided in the second distortion amplification system corresponding to the second input signal group, and thereby achieves good distortion compensation with respect to the distortion of the second input signal group.

In this manner, in the FF amplifier according to this embodiment, two auxiliary amplifiers are used: the auxiliary amplifier 12 corresponding to the two input signal groups of the first input signal group and the second input signal group, and the auxiliary amplifier 16 of the second distortion amplification system, so two pilot signals are used. For this reason, a constitution wherein two pilot signals are inserted for the signals subject to amplification and a constitution wherein signals corresponding to the two pilot signals are detected from the amplified signals after distortion are adopted.

Note that as the constitution for inserting two pilot signals for the signal subject to amplification, and the constitution for detecting signals corresponding to the two pilot signals from the amplified signal after distortion compensation, it is possible to use a single common coupler for two pilot signals.

In addition, in this embodiment, the lower the level of the signal corresponding to the first pilot signal contained in the amplified signal after distortion compensation or the signal corresponding to the second pilot signal is, the smaller the distortion in the first input signal group or the distortion in the second input signal group contained in this amplified signal after distortion compensation becomes.

Here follows an example of the operation performed by the FF amplifier according to this embodiment using an actual signal.

FIG. 2 shows an example of the case in which a signal consisting of a signal group in the wideband W-CDMA protocol and a Personal Communications Services (PCS) signal group is input to the FF amplifier according to this embodiment and amplified. Note that the graphs in FIG. 2(a) through FIG. 2(g) have the frequency on the x-axis and the signal level on the y-axis.

FIG. 2(a) shows an example of the signal input to the FF amplifier according to this embodiment, showing a first input signal group having a frequency bandwidth $\Delta F_1$ from the frequency $f_1$=1950 MHz to the frequency $f_2$=1970 MHz and a second input signal group having a frequency bandwidth $\Delta F_2$ from the frequency $f_3$=2130 MHz to the frequency $f_4$=215 MHz. Here, the first input signal group is a PCS signal group and the second input signal group is a W-CDMA signal group.

FIG. 2(b) shows, as one example of the signals output from the main amplifier 4, the first input signal group and second input signal group amplified by the main amplifier 4, the first pilot signal (PILOT1) amplified by the main amplifier 4 after insertion to the first input signal group, the second pilot signal (PILOT2) amplified by the main amplifier 4 after insertion to the second input signal group, the distortion arising in the main amplifier 4 due to the first input signal group and the distortion arising in the main amplifier 4 due to the second input signal group.

The distortion in the first input signal group may include distortion in the upside frequency band having a frequency bandwidth $\Delta F_1$ and distortion in the downside frequency band having a frequency bandwidth $\Delta F_1$, for example. Similarly, the distortion in the second input signal group may include distortion in the upside frequency band having a frequency bandwidth $\Delta F_2$ and distortion in the downside frequency band having a frequency bandwidth $\Delta F_2$, for example.

In addition, in this embodiment, the frequency bandwidth of the second input signal group is higher than the frequency bandwidth of the first input signal group, and the frequency gap $\Delta F_3$ between the distortion in the upside frequency band due to the first input signal group and the distortion in the downside frequency band due to the second input signal group is appropriately wide.

In FIG. 2(*b*) above, the first pilot signal and second pilot signal are shown by dotted lines.

Note that in FIG. 2(*b*) above, as an example of inserting pilot signals to both the first input signal group and second input signal group, the distortion arising in the main amplifier 4 and the pilot signal are set to the same frequency, but it is preferable to set the pilot signals to a frequency at which distortion does not occur.

FIG. 2(*c*) shows an example of the distortion components detected by the second coupler 23, where only the distortion components consisting of the distortion in the first input signal group and the distortion in the second input signal group are extracted.

FIG. 2(*d*) shows an example of the distortion in the first input signal group amplified by the auxiliary amplifier 12 of the first distortion amplification system, where only the distortion of the first input signal group is amplified.

FIG. 2(*e*) shows an example of the distortion in the second input signal group amplified by the auxiliary amplifier 16 of the second distortion amplification system, where only the distortion of the second input signal group is amplified.

FIG. 2(*f*) shows an example of the distortion amplified by distortion amplifier 18, where the distortion of the first input signal group and the distortion of the second input signal group is amplified.

FIG. 2(*g*) shows an example of the signal output from the signal output terminal Q1, showing the amplified first input signal group and second input signal group, where the distortion arising in the main amplifier 4 is compensated for by the distortion amplified by the distortion amplifier 18 in the third directional coupler 19.

As shown above, with the FF amplifier according to this embodiment, it has a feedforward loop consisting of a distortion detection loop and distortion compensation loop, and in the distortion compensation loop, the fourth directional coupler 8 which functions as a divider divides the distortion arising in the main amplifier 4, the bandpass filters 9 and 13, variable attenuators 10 and 14, second variable phase shifters 11 and 15 and auxiliary amplifiers 12 and 16 provided for each input signal group perform the amplification and other processes on each input signal group, and thereby the fifth directional coupler 17 which functions as a combiner performs the combination of the distortion of the plurality of input signal groups after this amplification, and thus distortion compensation is performed on the plurality of input signal groups using this constitution. In addition, in the FF amplifier according to this embodiment, different pilot signals are used for each input signal group, so feedback control is performed regarding the distortion compensation, and thus the feedforward loop is optimized.

In addition, the bandpass filters 9 and 13 provided in the distortion amplification systems of the distortion compensation loop have flat delay and flat amplification characteristics, and also, components of each input signal group with mutually separate frequencies (including distortion) are extracted from the input wave consisting of the mutually discontinuous frequency bands input to the FF amplifier according to this embodiment.

Accordingly, with the FF amplifier according to this embodiment, when a plurality of signal groups with mutually separated frequencies are input and amplification and distortion compensation are performed, the auxiliary amplifiers 12 and 16 are provided for each of the distortion of the respective input signal groups in the distortion compensation loop, so even if broadband frequency band characteristics are adopted for the respective auxiliary amplifiers 12 and 16, it is still possible to achieve precise distortion compensation, and thus it is possible to compensate for intermodulation and other types of nonlinear distortion, for example, that arises in the main amplifier 4.

As a specific example, with the FF amplifier according to this embodiment, when using an auxiliary amplifier that has roughly the same frequency characteristics as in the prior art, it is possible to compensate for distortion over a wider band than in the prior art.

In addition, with the FF amplifier according to this embodiment, when distortion compensation is performed on the signals received in the reception frequency bandwidth of a base station unit or the like for example, it is possible to perform distortion compensation simultaneously on the signals of a frequency band separated from the frequency band of these received signals.

Note that with the FF amplifier according to this embodiment, the functions of the second variable attenuator 10 and the functions of the third variable attenuator 14 constitute the distortion changer, while the functions of the second variable phase shifter 11 and the functions of the third variable phase shifter 15 constitute the phase shifter.

In addition, with the FF amplifier according to this embodiment, the functions of the first coupler 21 and the functions of the fourth coupler 22 constitute the pilot signal combining means, while the functions of the third coupler 24 and the functions of the fifth coupler 25 constitute the pilot signal corresponding signal detection means and the functions of the control circuit 31 having the control signal generation circuit 32 constitute the pilot signal control means.

Here, the constitution of the feedforward amplifier and other components according to the present invention is not necessarily limited to that presented above, but rather various constitutions may be used. Note that the present invention may also be provided as a method of executing the process according to the present invention, or as a computer program for implementing such a method.

In addition, the applicable fields of the present invention are not necessarily limited to those illustrated above, but rather the present invention may be applied to various fields.

In addition, the various processing performed in the feedforward amplifier or the like according to the present invention may be constituted by being implemented in hardware resources equipped with a processor and memory and the like, for example, being controlled by means of a processor executing a control program stored in read-only memory (ROM). In addition, the various functional means for executing this processing may also be constituted as independent hardware circuits.

In addition, the present invention may also be understood as one wherein the above control program (itself) is stored in a floppy disc®, CD-ROM or other computer-readable recording media, so that the processing according to the present invention can be implemented by loading said control program from the recording medium into a computer and executing the program by a processor.

As described above, with the feedforward amplifier according to the present invention, the feedforward amplifier inputs a plurality of signal groups, each having a different frequency bandwidth respectively, and in a distortion detection loop a main amplifier is used to amplify this plurality of input signal groups and detect the distortion arising in said main amplifier, and in a distortion compensation loop the distortion detected in the distortion detection loop is removed from the amplified signal from the main amplifier, so it is able to perform precise distortion compensation on a plurality of wideband signal groups as a whole without adopting broadband frequency-band characteristics for the auxiliary amplifier used to amplify the distortion detected by the distortion detection loop.

In addition, with the feedforward amplifier according to the present invention, as one sample configuration, the distortion amplification systems having distortion compensation loops comprise: a bandpass filter that extracts the distortion of the input signal group corresponding to each, an amplitude changer that changes the amplitude of the distortion extracted by the bandpass filter, a phase changer that changes the phase of the distortion extracted by the bandpass filter, and an auxiliary amplifier that amplifies the distortion whose amplitude is changed by the amplitude changer and whose phase is changed by the phase changer, and thus it is possible to control the amplitude and phase of the distortion when using the auxiliary amplifier to amplify the distortion in each input signal group in each distortion amplification system.

In addition, with the feedforward amplifier according to the present invention, as one sample configuration, pilot signals are provided for each input signal group, and pilot signal synthesizing means is provided for each input signal group for the plurality of input signal groups prior to amplification by the main amplifier provided in the distortion detection loop, and that synthesizes the same number of pilot signals as the number of input signal groups, pilot signal corresponding signal detection means detects signals corresponding to each pilot signal contained within the amplified signal from the main amplifier from which distortion is removed by the distortion compensation loop, pilot signal control means controls each of the distortion amplification systems having distortion compensation loops based on the results of detection by the pilot signal corresponding signal detection means so that the distortion contained in the amplified signal from the main amplifier with distortion removed by the distortion compensation loop is reduced, so precise distortion compensation can be performed on each input signal group.

What is claimed is:

1. A feedforward amplifier that inputs a plurality of signal groups, each having a different frequency bandwidth respectively, and that in a distortion detection loop uses a main amplifier to amplify this plurality of input signal groups and detect the distortion arising in said main amplifier, and in a distortion compensation loop removes the distortion detected in the distortion detection loop from the amplified signal from said main amplifier, wherein the feedforward amplifier is such that:

the distortion compensation loop has the same number of distortion amplification systems as the number of input signal groups that use an auxiliary amplifier to amplify distortion in each input signal group that contains distortion detected by the distortion detection loop, and that removes the sum total of the distortion of each input signal group amplified by this plurality of distortion amplification systems from the amplified signal from the main amplifier.

2. The feedforward amplifier according to claim 1, wherein:

the distortion amplification systems of the distortion compensation loop are provided with filters that extract the distortion in input signal groups corresponding to each and use auxiliary amplifiers to amplify the distortion extracted by said filters.

3. The feedforward amplifier according to claim 2, wherein:

the distortion amplification systems of the distortion compensation loop comprise: a bandpass filter that extracts the distortion of the input signal group corresponding to each, an amplitude changer that changes the amplitude of the distortion extracted by the bandpass filter, a phase changer that changes the phase of the distortion extracted by the bandpass filter, and an auxiliary amplifier that amplifies the distortion whose amplitude is changed by the amplitude changer and whose phase is changed by the phase changer.

4. The feedforward amplifier according to claim 3, wherein:

the feedforward amplifier is such that:

a bandpass filter that has flat delay characteristics and flat amplification characteristics in the frequency band of the extracted distortion is used as the bandpass filter provided in each of the distortion amplification systems of the distortion compensation loop.

5. The feedforward amplifier according to claim 1, wherein:

the feedforward amplifier comprises:

pilot signal synthesizing means provided for each input signal group for the plurality of input signal groups prior to amplification by the main amplifier provided in the distortion detection loop, and that synthesizes the same number of pilot signals as the number of input signal groups, pilot signal corresponding signal detection means that detects signals corresponding to each pilot signal contained within the amplified signal from the main amplifier from which distortion is removed by the distortion compensation loop, pilot signal control means that controls each of the distortion amplification systems of the distortion compensation loop based on the results of detection by the pilot signal corresponding signal detection means so that the distortion contained in the amplified signal from the main amplifier with distortion removed by the distortion compensation loop is reduced.

6. The feedforward amplifier according to claim 5, wherein:

the feedforward amplifier is such that:

the pilot signal synthesizing means consists of the same number of couplers as the number of input signal groups, the pilot signal corresponding signal detection means consists of the same number of couplers as the number of input signals, and the pilot signal control means controls the signal attenuation and signal phase shift in each distortion amplification system.

7. The feedforward amplifier according to claim 1, wherein:

the feedforward amplifier comprises:

division means that divides the distortion detected by the distortion detection loop among each of the distortion amplification systems, and combining means that obtains the sum total of distortion in each input signal group amplified by the auxiliary amplifier of each distortion amplification system.

8. The feedforward amplifier according to claim 5, wherein:

the feedforward amplifier comprises:

division means that divides the distortion detected by the distortion detection loop among each of the distortion amplification systems, and combining means that obtains the sum total of distortion in each input signal group amplified by the auxiliary amplifier of each distortion amplification system.

9. The feedforward amplifier according to claim 1, wherein:

the feedforward amplifier is such that:

the distortion detection loop comprises a directional coupler that divides the input signal into two branches, a variable attenuator that adjusts the amplitude of one branch of the signal, a variable phase shifter that adjusts the phase of one branch of the signal, a main amplifier that amplifies the one branch of the signal whose amplitude and phase were adjusted, delay means that delays the other branch of the signal, and a directional coupler that detects distortion contained in said amplified signal by coupling the amplified signal from the main amplifier to the other branch of the signal that was delayed by the delay means.

10. The feedforward amplifier according to claim 5, wherein:

the feedforward amplifier is such that:

the distortion detection loop comprises a directional coupler that divides the input signal into two branches, a variable attenuator that adjusts the amplitude of one branch of the signal, a variable phase shifter that adjusts the phase of one branch of the signal, a main amplifier that amplifies the one branch of the signal whose amplitude and phase were adjusted, delay means that delays the other branch of the signal, and a directional coupler that detects distortion contained in said amplified signal by coupling the amplified signal from the main amplifier to the other branch of the signal that was delayed by the delay means.

11. The feedforward amplifier according to claim 6, wherein:

the feedforward amplifier is such that:

the distortion detection loop comprises a directional coupler that divides the input signal into two branches, a variable attenuator that adjusts the amplitude of one branch of the signal, a variable phase shifter that adjusts the phase of one branch of the signal, a main amplifier that amplifies the one branch of the signal whose amplitude and phase were adjusted, delay means that delays the other branch of the signal, and a directional coupler that detects distortion contained in said amplified signal by coupling the amplified signal from the main amplifier to the other branch of the signal that was delayed by the delay means.

12. The feedforward amplifier according to claim 1, wherein:

the feedforward amplifier is such that:

the distortion compensation loop comprises: delay means that delays the amplified signal from the main amplifier of the distortion detection loop, dividing means that divides the distortion detected by the distortion detection loop among the distortion amplification systems, the same number of distortion amplification systems as the number of input signal groups, combining means that obtains the sum total of distortion in each input signal group amplified by the auxiliary amplifier of each distortion amplification system, a distortion amplifier that amplifies the result of combining by the combining means, and a directional coupler that couples the amplified signal from the main amplifier delayed by the delay means to the amplified distortion signal from the distortion amplifier, thereby removing distortion from the amplified signal from the main amplifier, and each distortion amplification system comprises: a bandpass filter that extracts a signal in the frequency band of each input signal group contained in the divided signals from the dividing means and in the frequency band of the distortion arising in the main amplifier due to each input signal group, a variable attenuator that adjusts the amplitude of the extracted signal, a variable phase shifter that adjusts the phase of the extracted signal, and an auxiliary amplifier that amplifies the extracted signal whose amplitude and phase are adjusted.

13. The feedforward amplifier according to claim 5, wherein:

the feedforward amplifier is such that:

the distortion compensation loop comprises: delay means that delays the amplified signal from the main amplifier of the distortion detection loop, dividing means that divides the distortion detected by the distortion detection loop among the distortion amplification systems, the same number of distortion amplification systems as the number of input signal groups, combining means that obtains the sum total of distortion in each input signal group amplified by the auxiliary amplifier of each distortion amplification system, a distortion amplifier that amplifies the result of combining by the combining means, and a directional coupler that couples the amplified signal from the main amplifier delayed by the delay means to the amplified distortion signal from the distortion amplifier, thereby removing distortion from the amplified signal from the main amplifier, and each distortion amplification system comprises: a bandpass filter that extracts a signal in the frequency band of each input signal group contained in the divided signals from the dividing means and in the frequency band of the distortion arising in the main amplifier due to each input signal group, a variable attenuator that adjusts the amplitude of the extracted signal, a variable phase shifter that adjusts the phase of the extracted signal, and an auxiliary amplifier that amplifies the extracted signal whose amplitude and phase are adjusted.

14. The feedforward amplifier according to claim 6, wherein:

the feedforward amplifier is such that:

the distortion compensation loop comprises: delay means that delays the amplified signal from the main amplifier of the distortion detection loop, dividing means that divides the distortion detected by the distortion detection loop among the distortion amplification systems, the same number of distortion amplification systems as the number of input signal groups, combining means that obtains the sum total of distortion in each input signal group amplified by the auxiliary amplifier of each distortion amplification system, a distortion amplifier that amplifies the result of combining by the combining means, and a directional coupler that couples the amplified signal from the main amplifier delayed by the delay means to the amplified distortion signal from the distortion amplifier, thereby removing distortion from the amplified signal from the main amplifier, and each distortion amplification system comprises: a bandpass filter that extracts a signal in the frequency band of each input signal group contained in the divided signals from the dividing means and in the frequency band of the distortion arising in the main amplifier due to each input signal group, a variable attenuator that adjusts the amplitude of the extracted signal, a variable phase shifter that adjusts the phase of the extracted signal, and an auxiliary amplifier that amplifies the extracted signal whose amplitude and phase are adjusted.

15. The feedforward amplifier according to claim 11, wherein:

the feedforward amplifier is such that:

the distortion compensation loop comprises: delay means that delays the amplified signal from the main amplifier of the distortion detection loop, dividing means that divides the distortion detected by the distortion detection loop among the distortion amplification systems, the same number of distortion amplification systems as the number of input signal groups, combining means that obtains the sum total of distortion in each input signal group amplified by the auxiliary amplifier of each distortion amplification system, a distortion amplifier that amplifies the result of combining by the combining means, and a directional coupler that couples the amplified signal from the main amplifier delayed by the delay means to the amplified distortion signal from the distortion amplifier, thereby removing distortion from the amplified signal from the main amplifier, and each distortion amplification system comprises: a bandpass filter that extracts a signal in the frequency band of each input signal group contained in the divided signals from the dividing means and in the frequency band of the distortion arising in the main amplifier due to each input signal group, a variable attenuator that adjusts the amplitude of the extracted signal, a variable phase shifter that adjusts the phase of the extracted signal, and an auxiliary amplifier that amplifies the extracted signal whose amplitude and phase are adjusted.

16. A communications station unit provided in a mobile communications system that uses a feedforward amplifier to amplify a multi-carrier signal with respect to the other party in communications, compensates for the distortion generated at the time of this amplification, and wirelessly transmits this amplified signal to the other party in communications, wherein:

said feedforward amplifier has a constitution whereby it inputs a plurality of signal groups, each having a different frequency bandwidth respectively, and that in a distortion detection loop uses a main amplifier to amplify this plurality of input signal groups and detect the distortion arising in said main amplifier, and in a distortion compensation loop removes the distortion detected in the distortion detection loop from the amplified signal from said main amplifier, and in said feedforward amplifier, the distortion compensation loop has the same number of distortion amplification systems as the number of input signal groups that use an auxiliary amplifier to amplify distortion in each input signal group that contains distortion detected by the distortion detection loop, and that removes the sum total of the distortion of each input signal group amplified by this plurality of distortion amplification systems from the amplified signal from the main amplifier.

17. The communications station unit according to claim 16, wherein:

the feedforward amplifier comprises: pilot signal synthesizing means provided for each input signal group for the plurality of input signal groups prior to amplification by the main amplifier provided in the distortion detection loop, and that synthesizes the same number of pilot signals as the number of input signal groups, pilot signal corresponding signal detection means that detects signals corresponding to each pilot signal contained within the amplified signal from the main amplifier from which distortion is removed by the distortion compensation loop, pilot signal control means that controls each of the distortion amplification systems of the distortion compensation loop based on the results of detection by the pilot signal corresponding signal detection means so that the distortion contained in the amplified signal from the main amplifier with distortion removed by the distortion compensation loop is reduced.

18. The communications station unit according to claim 17, wherein:

in the feedforward amplifier, the pilot signal synthesizing means consists of the same number of couplers as the number of input signal groups, the pilot signal corresponding signal detection means consists of the same number of couplers as the number of input signals, and the pilot signal control means controls the signal attenuation and signal phase shift in each distortion amplification system.

19. The communications station unit according to claim 16, wherein:

in the feedforward amplifier, the distortion detection loop comprises a directional coupler that divides the input signal into two branches, a variable attenuator that adjusts the amplitude of one branch of the signal, a variable phase shifter that adjusts the phase of one branch of the signal, a main amplifier that amplifies the one branch of the signal whose amplitude and phase were adjusted, delay means that delays the other branch of the signal, and a directional coupler that detects distortion contained in said amplified signal by coupling the amplified signal from the main amplifier to the other branch of the signal that was delayed by the delay means.

20. The communications station unit according to claim 16, wherein:

in the feedforward amplifier, the distortion compensation loop comprises: delay means that delays the amplified signal from the main amplifier of the distortion detection loop, dividing means that divides the distortion detected by the distortion detection loop among the distortion amplification systems, the same number of distortion amplification systems as the number of input signal groups, combining means that obtains the sum total of distortion in each input signal group amplified by the auxiliary amplifier of each distortion amplification system, a distortion amplifier that amplifies the result of combining by the combining means, and a directional coupler that couples the amplified signal from the main amplifier delayed by the delay means to the amplified distortion signal from the distortion amplifier, thereby removing distortion from the amplified signal from the main amplifier, and each distortion amplification system comprises: a bandpass filter that extracts a signal in the frequency band of each input signal group contained in the divided signals from the dividing means and in the frequency band of the distortion arising in the main amplifier due to each input signal group, a variable attenuator that adjusts the amplitude of the extracted signal, a variable phase shifter that adjusts the phase of the extracted signal, and an auxiliary amplifier that amplifies the extracted signal whose amplitude and phase are adjusted.

* * * * *